(12) United States Patent
Uhlenbrock et al.

(10) Patent No.: US 6,352,580 B1
(45) Date of Patent: Mar. 5, 2002

(54) COMPLEXES HAVING TRIS(PYRAZOLYL) BORATE LIGANDS FOR FORMING FILMS

(75) Inventors: Stefan Uhlenbrock, Boise; Brian A. Vaartstra, Nampa, both of ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/631,498

(22) Filed: Aug. 3, 2000

Related U.S. Application Data

(62) Division of application No. 09/141,432, filed on Aug. 27, 1998, now Pat. No. 6,127,192.

(51) Int. Cl.[7] .................... C23C 16/06; C07D 231/00
(52) U.S. Cl. ................ 106/1.05; 106/1.12; 106/1.25; 106/287.18; 106/287.19; 548/373.1
(58) Field of Search ................ 106/1.05, 1.12, 106/1.25, 287.18, 287.19; 548/373.1

(56) References Cited

U.S. PATENT DOCUMENTS

| | | | | |
|---|---|---|---|---|
| 5,122,247 A | * | 6/1992 | Kokado et al. | 204/181.1 |
| 5,192,579 A | * | 3/1993 | Uemiya et al. | 427/571 |
| 5,255,258 A | | 10/1993 | Kawade et al. | 369/126 |
| 5,453,494 A | | 9/1995 | Kirlin et al. | 534/15 |
| 5,583,205 A | * | 12/1996 | Rees, Jr. | 427/124 |
| 5,726,294 A | * | 3/1998 | Rees, Jr. | 427/124 |
| 6,127,192 A | | 10/2000 | Uhlenbrock et al. | 438/4 |
| 6,133,161 A | * | 10/2000 | Uhlenbrock et al. | 438/778 |

OTHER PUBLICATIONS

Belderrain et al., "Bis—and Tris(Pyrazolyl)Borate Complexes of the Heavier Alkaline–Earth Elements Ca, Sr and Ba," *Polyhedron*, 15, 3453–3463, 2/96.

Dutremez et al., "HB(3,5–Me$_2$pyrazolyl)$_3$—as an encapsulating ligang for Ba$^{11}$," *Journal of Organometallic Chemistry*, 462,C1–C2, 3/93.

Juliá et al., "Improved Synthesis of Polyazolylmethanes Under Solid–Liquid Phase–Transfer Catalysis," *Organic Preparations and Procedures Inc.*, 16(5), 299–307 (1984), no month available.

Lang et al., "Investigation of the film growth of a new titanium precursor for MOCVD," *J. Non–Crystalline Solids*, 187, 430–434 (1995), no month available.

Macchioni et al., "Cationic Bis–and Tris($\eta$2–(pyrazol–1–y1)methane) Acetyl Complexes of Iron (II) and Ruthenium (II): Synthesis, Characterization, Reactivity, and Interionic Solution Structure by NOESY NMR Spectroscopy," *Organometallics*, 16, 2139–2145 (1997), no month available.

Trofimenko et al., "Boron–Pyrazole Chemistry IV. Carbon—and Boron—Substituted Poly (1–pyrazole) borates," *J. Amer. Chem. Soc.*, 89, 6288–6294, 6/67.

Trofimenko et al., "Genimal Poly. (1–pyrazolyl) alkalines and Their Coordination Chemistry," *J. Amer. Chem. Soc.*, 92(17), 5118–5127, 3/70.

Versteeg et al., "Metalorganic Chemical Vapor Deposition By Pulsed Liquid Injection Using An Ultrasonic Nozzle: Titanium Dioxide on Sapphire from Titanium (IV) Isopropoxide," *Journal of the American Ceramic Soc.*,78, 2763–2768, 10/95.

* cited by examiner

*Primary Examiner*—Helene Klemanski
(74) *Attorney, Agent, or Firm*—Mueting, Raasch & Gebhardt, P.A.

(57) ABSTRACT

Methods of forming a film on a substrate using chemical vapor deposition techniques and pyrazolyl complexes. The complexes and methods are particularly suitable for the preparation of semiconductor structures.

27 Claims, 3 Drawing Sheets

COMPLEXES HAVING TRIS(PYRAZOLYL) BORATE LIGANDS FOR FORMING FILMS

This is a division of application Ser. No. 09/141,432, filed Aug. 27, 1998, now U.S. Pat. No. 6,127,192, which is incorporated herein by reference.

FIELD OF THE INVENTION

This invention relates to methods of depositing films, such as metal oxide films, especially barium-strontium-titanate (BST) films on substrates, particularly semiconductor device structures.

BACKGROUND OF THE INVENTION

Capacitors are the basic energy storage devices in random access memory devices, such as dynamic random access memory (DRAM) devices, static random access memory (SRAM) devices, and now ferroelectric memory (FE RAM) devices. They consist of two conductors, such as parallel metal or polysilicon plates, which act as the electrodes (i.e., the storage node electrode and the cell plate capacitor electrode), insulated from each other by a dielectric material (a ferroelectric dielectric material for FE RAMs).

High quality thin oxide films of metals, such as barium-strontium-titanates and strontium-bismuth-tantalates, for example, deposited on semiconductor wafers have recently gained interest for use in memories. These materials have very high dielectric constants and excellent resistance to fatigue. They also have suitable properties for a variety of other uses, such as electrooptic materials, pyroelectric materials, and antireflective coatings.

Suitable metal oxides are typically delivered to a substrate in the vapor phase; however, many oxides are difficult to deliver using vapor deposition technology. Many precursors are sensitive to thermal decomposition. Also, many precursors have vapor pressures that are too low for effective vapor deposition. Thus, there is a continuing need for methods and materials for the deposition of oxide films using vapor deposition processes on semiconductor structures, particularly random access memory devices.

SUMMARY OF THE INVENTION

The present invention is directed to complexes and methods for forming metal-containing films on substrates, such as semiconductor substrates or substrate assemblies during the manufacture of semiconductor structures, particularly memory devices. The method involves forming a film using a complex having one or more tris(pyrazolyl)borate ligands (referred to herein as pyrazolyl complexes). Typically and preferably, the film is a dielectric metal-containing material. The metal-containing film can be an oxide, sulfide, selenide, telluride, nitride, or combination thereof, for example. Preferably, the film is a metal-containing oxide film. The film can be used as a dielectric layer in an integrated circuit structure, particularly in a memory device such as a ferroelectric memory device.

The methods involve vaporizing a precursor composition comprising one or more, and preferably, two or more, pyrazolyl complexes and directing it toward a substrate, such as a semiconductor substrate or substrate assembly, using a chemical vapor deposition technique to form a metal-containing film on a surface of the substrate, wherein the pyrazolyl complex includes one or more anionic tris(pyrazolyl)borate ligands of the formula:

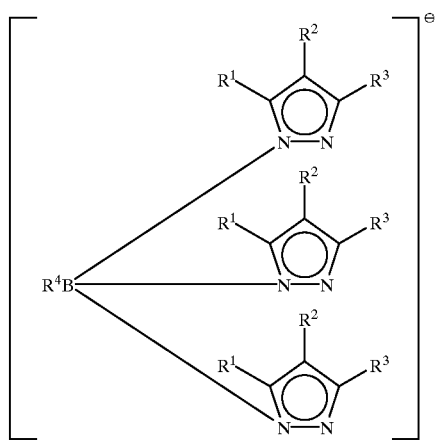

Formula I wherein the $R^1$, $R^2$, $R^3$, and $R^4$ groups are each individually H, an organic group, or a halide (preferably, the $R^4$ group is H or an organic group). Preferably, the pyrazolyl complex includes one or more ligands of Formula I attached to a metal selected from the group of the Group IIA (i.e., Group 2) metals, the Group IVB (i.e., Group 4) metals, the Group VA (i.e., Group 15), and the Group VB (i.e., Group 5) metals. More preferably, such complexes are of the following formulas: $ML_2$ (Formula II), $M(O)L_2$ (Formula III), $M(OR^5)_x L_{4-x}$ (Formula IV), and $M(OR^5)_y L_{5-y}$ (Formula V), wherein M is as defined above, L is the ligand of Formula I as defined above, each $R^5$ group is independently an organic group, x is 2 to 4 (preferably, 2 or 3), and y is 2 to 5 (preferably, 3 or 4). For certain of the preferred embodiments, the precursor composition includes at least one pyrazolyl complex that includes a metal selected from the group of Zr, Hf, V, Nb, and Ta.

The pyrazolyl complexes are neutral complexes and may be liquids or solids at room temperature, but they are typically solids. If they are solids, they are preferably sufficiently soluble in an organic solvent or have melting points below their decomposition temperatures such that they can be used in flash vaporization, bubbling, microdroplet formation techniques, etc. However, they may also be sufficiently volatile that they can be vaporized or sublimed from the solid state using known chemical vapor deposition techniques. Thus, the precursor compositions of the present invention can be in solid or liquid form. As used herein, "liquid" refers to a solution or a neat liquid (a liquid at room temperature or a solid at room temperature that melts at an elevated temperature). As used herein, a "solution" does not require complete solubility of the solid; rather, the solution may have some undissolved material, preferably, however, there is a sufficient amount of the material that can be carried by the organic solvent into the vapor phase for chemical vapor deposition processing.

Methods of the present invention are particularly well suited for forming films on a surface of a semiconductor substrate or substrate assembly, such as a silicon wafer, with or without layers or structures formed thereon, used in forming integrated circuits. For example, the methods can involve manufacturing a memory device by providing a substrate having a first electrode thereon, vaporizing a precursor composition and directing it toward the substrate to form a dielectric layer comprising an oxide film on the first electrode of the substrate, and forming a second electrode on the dielectric layer.

It is to be understood that methods of the present invention are not limited to deposition on silicon wafers; rather, other types of wafers (e.g., gallium arsenide wafer, etc.) can be used as well. Also, methods of the present invention can be used in silicon-on-insulator technology. Furthermore, substrates other than semiconductor substrates or substrate assemblies can be used in methods of the present invention. These include, for example, fibers, wires, etc. If the substrate is a semiconductor substrate or substrate assembly, the films can be formed directly on the lowest semiconductor surface of the substrate, or they can be formed on any of a variety of the layers (i.e., surfaces) as in a patterned wafer, for example. Thus, the term "semiconductor substrate" refers to the base semiconductor layer, e.g., the lowest layer of silicon material in a wafer or a silicon layer deposited on another material such as silicon on sapphire. The term "semiconductor substrate assembly" refers to the semiconductor substrate having one or more layers or structures formed thereon.

A particularly preferred embodiment of the present invention is a method of forming a film using a liquid precursor composition (typically, a solid pyrazolyl complex dissolved in an organic solvent). The liquid precursor composition includes one or more pyrazolyl complexes of Formulas II–V, which may be liquids or solids dissolved in an organic solvent, for example. The liquid precursor composition may also include other complexes of the metals of Groups IIA, IVB, VA, and VB that do not include any ligands of Formula I. The method involves vaporizing the precursor composition to form vaporized precursor composition; and directing the vaporized precursor composition toward the substrate to form a film on the substrate. Herein, vaporized precursor composition includes vaporized molecules of pyrazolyl complexes described herein either alone or optionally with vaporized molecules of other compounds in the precursor composition, including solvent molecules, if used.

The present invention further provides a chemical vapor deposition precursor composition comprising one or more, and preferably, two or more, pyrazolyl complexes described herein. Also provided are complexes of Formulas III–V.

DETAILED DESCRIPTION

Figure 1:
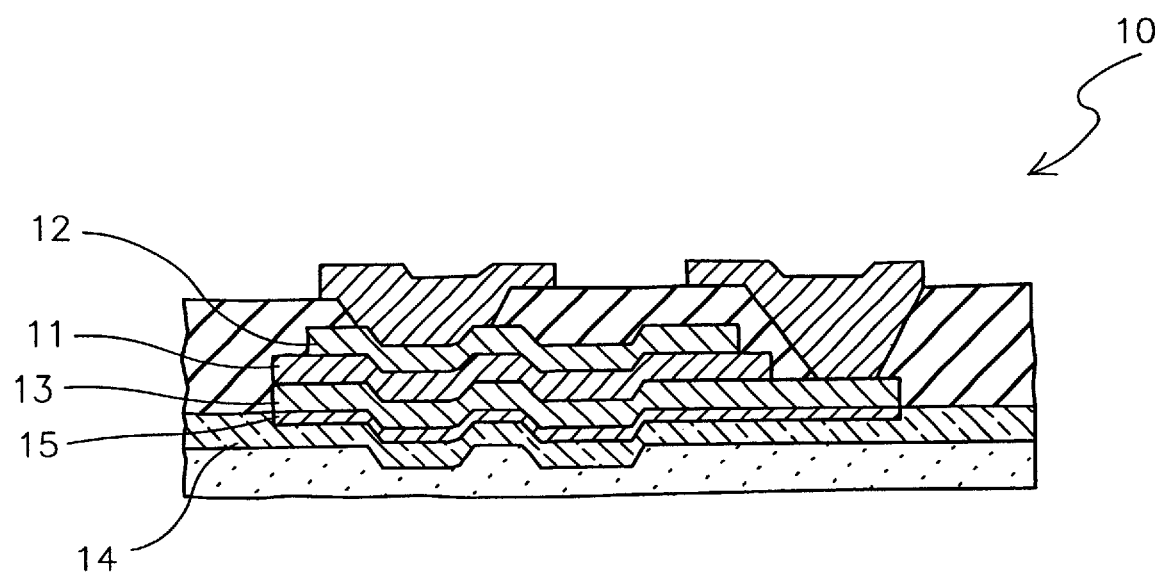
FIG. 1 is a cross-sectional schematic of a thin layer ferroelectric memory device having a ferroelectric oxide layer between the electrodes.

The present invention provides a method of forming a film (preferably, an oxide film) using one or more pyrazolyl complexes (i.e., metal complexes containing one or more trispyrazolyl)borate ligands). Preferably, the pyrazolyl complexes are mononuclear (i.e., monomers) and display few intermolecular forces of attraction. Thus, they are preferably volatile (or sublimable) and transportable in the gas phase. They may be liquids at room temperature, although they are typically solids. If they are solids, they are sufficiently soluble in an organic solvent to allow for vaporization, they can be vaporized or sublimed from the solid state, or they have melting points below their decomposition temperatures. Thus, many of the complexes described herein are suitable for use in chemical vapor deposition (CVD) techniques, such as flash vaporization techniques, bubbler techniques, and/or microdroplet techniques. Preferred embodiments of the complexes described herein are particularly suitable for low temperature CVD, e.g., deposition techniques involving substrate temperatures of about 200° C. to about 400° C.

The solvents that are suitable for this application can be one or more of the following: aliphatic hydrocarbons or unsaturated hydrocarbons ($C_3$–$C_{20}$, and preferably $C_5$–$C_{10}$, cyclic, branched, or linear), aromatic hydrocarbons ($C_5$–$C_2$, and preferably $C_5$–$C_{10}$), halogenated hydrocarbons, silylated hydrocarbons such as alkylsilanes, alkylsilicates, ethers, polyethers, thioethers, esters, lactones, ammonia, amides, amines (aliphatic or aromatic, primary, secondary or tertiary), polyamines, nitriles, cyanates, isocyanates, thiocyanates, silicone oils, aldehydes, ketones, diketones, carboxylic acids, water, alcohols, thiols, or compounds containing combinations of any of the above or mixtures of one or more of the above. It should be noted that some precursor complexes are sensitive to reactions with protic solvents, and examples of these noted above may not be ideal, depending on the nature of the precursor complex. The complexes are also generally compatible with each other, so that mixtures of variable quantities of the complexes will not interact to significantly change their physical properties.

Methods of the present invention involve vaporizing a precursor composition, preferably a liquid precursor composition, that includes one or more pyrazolyl complexes. If more than one metal is desired in the resulting metal-containing film (i.e., if a metal alloy film is desired), the precursor composition can include more than one pyrazolyl complex. Alternatively, various percursor compositions can be used, each of which include one pyrazolyl complex, for example. The precursor compositions can be vaporized in the presence of a gas, which can be inert (i.e., a carrier gas) or reactive with the pyrazolyl complex (i.e., a reaction gas), to form a film.

The carrier gas can be selected from a wide variety of gases that are generally unreactive with the pyrazolyl complexes described herein and do not interfere with the formation of a metal-containing film. Examples include nitrogen, helium, argon, and mixtures thereof. The reaction gas can be selected from a wide variety of gases reactive with the pyrazolyl complexes, at least at a substrate surface under the conditions of chemical vapor deposition. Examples of reaction gases include oxygen, ozone, nitrogen oxides, ammonia, hydrazine, water vapor, hydrogen sulfide, hydrogen selenide, and hydrogen telluride. Various combinations of carrier gases and/or reaction gases can be used in the methods of the present invention.

The resultant film therefore can be an oxide, sulfide, nitride, selenide, telluride, etc., or mixtures thereof, for example. Preferably, the film formed is an oxide film. A film can be deposited in a wide variety of thicknesses, depending on the desired use. Preferably, the oxide film formed can be used as the dielectric material (e.g., ferroelectric material) between the plates (i.e., electrodes) in memory devices, such as ferroelectric memories.

The designation "pyrazolyl complex" refers to a metal complex containing one or more anionic pyrazolyl ligands. Any of a variety of pyrazolyl ligands can be present in the pyrazolyl complex as long as the complex can be used to form a film using chemical vaporization techniques. The pyrazolyl ligand stabilizes the metal complex and can be tailored to yield desired solubility and viscosity characteristics. Preferably, the anionic pyrazolyl ligand has the following formula:

Formula I

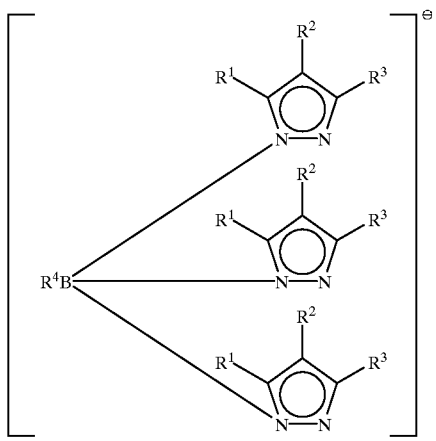

wherein the $R^1$, $R^2$, $R^3$, and $R^4$ groups are each individually H, an organic group, or a halide, and preferably, the $R^4$ group is H or an organic group. Such ligands can bond to a metal through one, two, or all three pyrazole groups.

The pyrazolyl complex can also include other ligands, such as alkoxy groups, aryloxy groups, and oxo groups. Preferably, the pyrazolyl complex includes one or more ligands of Formula I attached to a metal selected from the group of the Group IIA metals (i.e., Group 2 or alkaline earth metals), the Group IVB metals (i.e., Group 4 or titanium group metals), the Group VA metals (i.e., Group 15 or Bi) and the Group VB metals (i.e., Group 5 or vanadium group metals). More preferably, such complexes are of the following formulas: $ML_2$ Formula II), $M(O)L_2$ (Formula III), $M(OR^5)_xL_{4-x}$ (formula IV), and $M(OR^5)_yL_{5-y}$ (Formula V), wherein M is as defined above, L is the ligand of Formula I as defined above, $R^5$ is an organic group, x is 2 to 4 (preferably, 2 or 3), and y is 2 to 5 (preferably, 3 or 4). These complexes are monomers (i.e., mononuclear) in that they contain one metal per molecule.

As used herein, the term "organic group" means a hydrocarbon group (with optional elements other than C and H, such as O, N, S, and Si) that is classified as an aliphatic group, cyclic group, or combination of aliphatic and cyclic groups (e.g., alkaryl and aralkyl groups). In the context of the present invention, the organic groups are those that do not interfere with the formation of a metal-containing film. Preferably, they are of a type and size that do not interfere with the formation of a metal-containing film using chemical vapor deposition techniques. The term "aliphatic group" means a saturated or unsaturated linear or branched hydrocarbon group. This term is used to encompass alkyl, alkenyl, and alkynyl groups, for example. The term "alkyl group" means a saturated linear or branched hydrocarbon group including, for example, methyl, ethyl, isopropyl, t-butyl, heptyl, dodecyl, octadecyl, amyl, 2-ethylhexyl, and the like. The term "alkenyl group" means an unsaturated, linear or branched hydrocarbon group with one or more carbon-carbon double bonds, such as a vinyl group. The term "alkynyl group" means an unsaturated, linear or branched hydrocarbon group with one or more carbon-carbon triple bonds. The term "cyclic group" means a closed ring hydrocarbon group that is classified as an alicyclic group, aromatic group, or heterocyclic group. The term "alicyclic group" means a cyclic hydrocarbon group having properties resembling those of aliphatic groups. The term "aromatic group" or "aryl group" means a mono- or polynuclear aromatic hydrocarbon group. The term "heterocyclic group" means a closed ring hydrocarbon in which one or more of the atoms in the ring is an element other than carbon (e.g., nitrogen, oxygen, sulfur, etc.).

Substitution is anticipated in the complexes of the present invention. As a means of simplifying the discussion and the recitation of certain terminology used throughout this application, the terms "group" and "moiety" are used to differentiate between chemical species that allow for substitution or that may be substituted and those that do not so allow or may not be so substituted. Thus, when the term "group" is used to describe a chemical substituent, the described chemical material includes the unsubstituted group and that group with nonperoxidic O, N, S, or Si atoms, for example, in the chain (as in an alkoxy group) as well as carbonyl groups or other conventional substitution. Where the term "moiety" is used to describe a chemical compound or substituent, only an unsubstituted chemical material is intended to be included. For example, the phrase "alkyl group" is intended to include not only pure open chain saturated hydrocarbon alkyl substituents, such as methyl, ethyl, propyl, t-butyl, and the like, but also alkyl substituents bearing further substituents known in the art, such as hydroxy, alkoxy, alkylsulfonyl, halogen atoms, cyano, nitro, amino, carboxyl, etc. Thus, "alkyl group" includes ether groups, haloalkyls, nitroalkyls, carboxyalkyls, hydroxyalkyls, sulfoalkyls, etc. On the other hand, the phrase "alkyl moiety" is limited to the inclusion of only pure open chain saturated hydrocarbon alkyl substituents, such as methyl, ethyl, propyl, t-butyl, and the like. Thus, the term "organic group" includes within its scope unsubstituted hydrocarbyl moieties (groups with only carbon and hydrogen atoms), substituted hydrocarbyl groups (e.g., halogenated hydrocarbyl groups), ethers, amines, and silanes.

Preferred $R^1$, $R^2$, and $R^3$ groups in the pyrazolyl ligand of Formula I include H, $(C_1-C_{30})$organic groups, and halides. More preferred $R^1$, $R^2$, and $R^3$ groups of Formula I include H, $(C_1-C_{20})$organic groups, and halides. Most preferred $R^1$, $R^2$, and $R^3$ groups of Formula I include H and, $(C_1-C_8)$ organic groups. Particularly preferred $R^4$ groups in the pyrazolyl ligand of Formula I include H and $(C_1-C_{30})$ organic groups. More preferred $R^4$ groups of Formula I include H and $(C_1-C_{20})$organic groups. Most preferred $R^4$ groups of Formula I include H and $(C_1-C_8)$organic groups. Of the organic groups in Formula I, nonaromatic groups (e.g., aliphatic groups and alicyclic groups, which may or may not include unsaturation, and which may or may not include heteroatoms such as N, O, S, P, Si, etc.) are preferred. Of these, unsubstituted hydrocarbyls (typically, alkyl moieties), halogenated hydrocarbyls (typically, halogenated alkyl groups), ethers (i.e., $—R^6OR^7$ or $—OR^7$ groups, wherein $R^6$ is a divalent alkylene moiety, preferably, a $(C_1-C_5)$alkylene moiety and each $R^7$ is independently an alkyl moiety, preferably, a $(C_1-C_4)$alkyl moiety), amines (i.e., $—R^6N(R^7)_2$ or $—N(R^7)_2$ groups, wherein $R^6$ is a divalent alkylene moiety, preferably, a $(C_1-C_5)$alkylene moiety and each $R^7$ is independently an alkyl moiety, preferably, a $(C_1-C_4)$alkyl moiety), and silanes (i.e., $—R^6Si(R^7)_3$ or $—Si(R^7)_3$ groups, wherein $R^6$ is a divalent alkylene moiety, preferably, a $(C_1-C_5)$alkylene moiety and each $R^7$ is independently an alkyl moiety, preferably, a $(C_1-C_4)$alkyl moiety) are preferred. Most preferably, $R^1$, $R^2$, $R^3$, and $R^4$ are each independently H or $(C_1-C_4)$alkyl moieties.

A preferred class of pyrazolyl complexes include those in which $R^1$ and $R^3$ are methyl, and $R^2$ and $R^4$ are hydrogen.

Another preferred class of pyrazolyl complexes include those in which each of $R^1$ to $R^4$ is hydrogen.

The $R^5$ group in the complex of Formulas IV and V (i.e., $M(OR^5)_xL_{4-x}$ and $M(OR^5)_yL_{5y}$, respectively) is preferably a ($C_1$–$C_{20}$)organic group, more preferably, a ($C_1$–$C_8$)organic group, and most preferably, a ($C_1$–$C_4$)organic group. Of these organic groups, unsubstituted hydrocarbyl moieties are more preferred, and alkyl moieties are most preferred.

In the pyrazolyl complexes of Formulas II–V, M refers to a metal of Groups IIA (alkaline earth metals), IVB (the titanium group), VA (Bi), and VB (the vanadium group). Preferred metals M in Formulas II–V include, Ba, Sr, Ti, Nb, and Ta. Particularly preferred metals M include Ba, Sr, and Ti.

The pyrazolyl ligands of Formula I can be prepared by the reaction of $KBH_4$ with three equivalents of the pyrazole. The pyrazolyl complexes of Formulas II–V of the present invention can be prepared by the above potassium pyrazolate with the appropriate metal halide (e.g., $BaI_2$, $SrI_2$, or $Ti(OR)_2Cl_2$).

Various combinations of the compounds described herein can be, used in a precursor composition for chemical vapor deposition. Thus, as used herein, a "precursor composition" refers to a liquid or solid that includes one or more compounds of the formulas described herein optionally mixed with one or more complexes without ligands of Formula I. The precursor composition can also include one or more organic solvents suitable for use in a chemical vapor deposition system, as well as other additives, such as free ligands, that assist in the vaporization of the desired compounds.

Preferably, a precursor composition of the present invention includes one or more complexes of Formulas II–V. Such preferred precursor compositions can also include complexes of Groups IIA, IVB, VA, and VB metals or other metal or metalloid complexes that do not include the ligand of Formula I, as long as there is at least one complex of Formulas II–V. Such complexes include, for example, $Ba(thd)_2$, $Sr(thd)_2$, $Ba(hfacac)_2$, $Sr(hfacac)_2$, $Ti(OR^5)_4$, $Ti(OR^5)_2(thd)_2$, $Ti(O)(thd)_2$, $Bi(thd)_3$, $Bi(OR^5)_3$, $Bi(Ph)_3$, $Nb(OR^5)_5$, $Ta(OR^5)_5$, $Nb(OR^5)_z(thd)_{5-z}$, and $Ta(OR^5)_z(thd)_{5-z}$, wherein thd=2,2,6,6-tetramethylheptane-3,5-dione, hfacac=hexafluoroacetyl acetonate, z is 2 to 5 (preferably, 3 or 4), and $R^5$ is as defined above.

As stated above, the use of the pyrazolyl complexes and methods of forming films, particularly oxide films, of the present invention are beneficial for a wide variety of thin film applications in semiconductor structures, particularly those using high dielectric materials or ferroelectric materials. For example, such applications include capacitors such as planar cells, trench cells (e.g., double sidewall trench capacitors), stacked cells (e.g., crown, V-cell, delta cell, multi-fingered, or cylindrical container stacked capacitors), as well as field effect transistor devices.

A specific example of where a film formed from the complexes of the present invention would be useful is the ferroelectric memory cell 10 of FIG. 1. The memory cell 10 includes a ferroelectric material 1, which is prepared by depositing one or more of the complexes discussed herein using chemical vapor techniques, between two electrodes 12 and 13, which are typically made of platinum, although other metals such as gold or aluminum can also be used. The bottom electrode 13 is typically in contact with a silicon-containing layer 14, such as an n-type or p-type silicon substrate, silicon dioxide, glass, etc. A conductive barrier layer 15 is positioned between the bottom electrode 13 and the silicon-containing layer 14 to act as a barrier layer to diffusion of atoms such as silicon into the electrode and ferroelectric material.

Methods of the present invention can be used to deposit a metal-containing film, preferably an oxide film, on a variety of substrates, such as a semiconductor wafer (e.g., silicon wafer, gallium arsenide wafer, etc.), glass plate, etc., and on a variety of surfaces of the substrates, whether it be directly on the substrate itself or on a layer of material deposited on the substrate as in a semiconductor substrate assembly. The film is deposited upon decomposition (typically, thermal decomposition) of a pyrazolyl complex, preferably one that is either a volatile liquid, a sublimable solid, or a solid that is soluble in a suitable solvent that is not detrimental to the substrate, other layers thereon, etc. Preferably, however, solvents are not used; rather, the transition metal complexes are liquid and used neat. Methods of the present invention preferably utilize vapor deposition techniques, such as flash vaporization, bubbling, etc.

Figure 2:
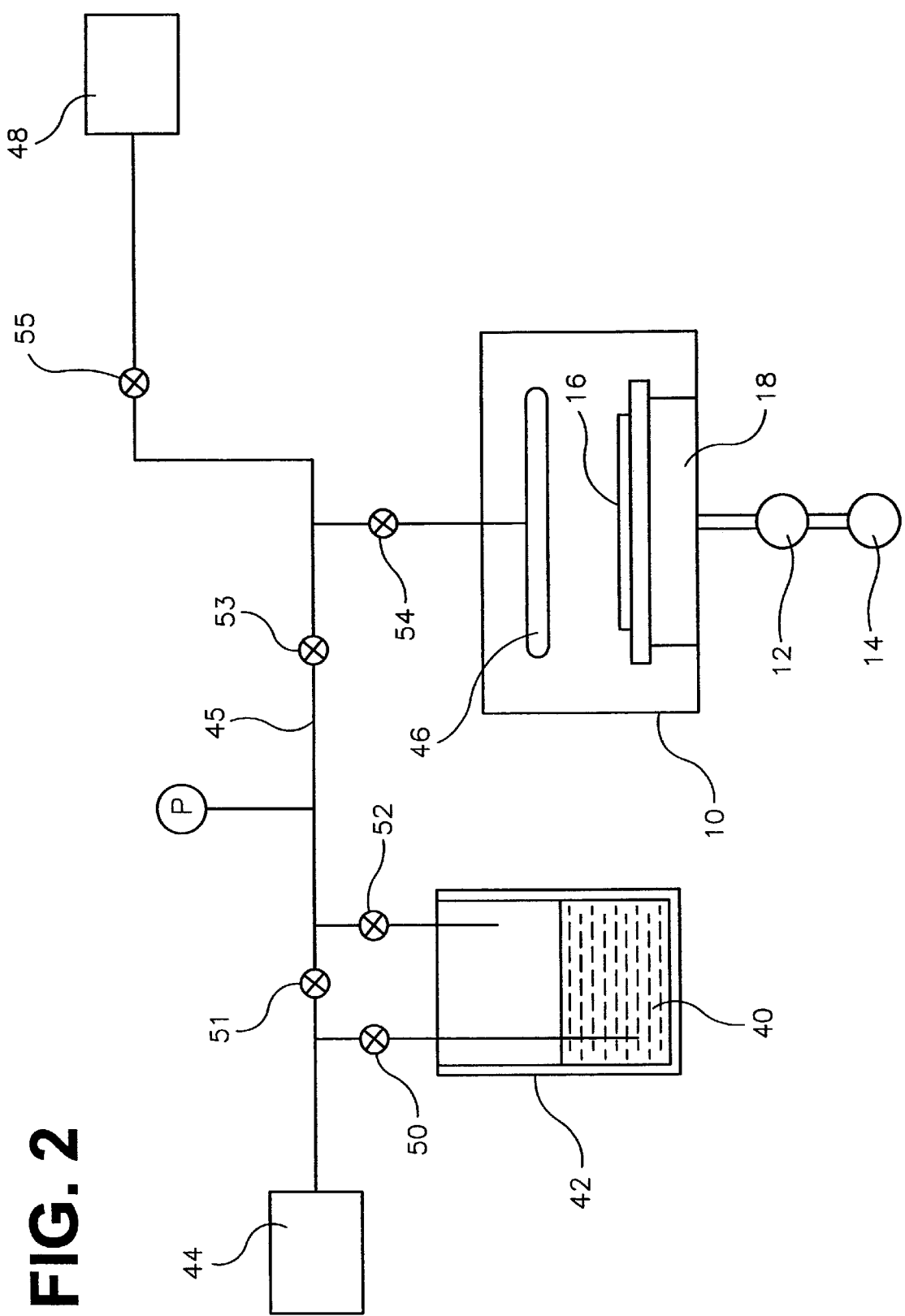
FIG. 2 is a perspective view of a chemical vapor deposition coating system suitable for use in the method of the present invention.

A typical chemical vapor deposition (CVD) system that can be used to perform the process of the present invention is shown in FIG. 2. The system includes an enclosed chemical vapor deposition chamber 10, which may be a cold wall-type CVD reactor. As is conventional, the CVD process may be carried out at pressures of from atmospheric pressure down to about $10^{-3}$ torr, and preferably from about 10 torr to about 0.1 torr. A vacuum may be created in chamber 10 using turbo pump 12 and backing pump 14.

One or more substrates 16 (e.g., semiconductor substrates or substrate assemblies) are positioned in chamber 10. A constant nominal temperature is established for the substrate, preferably at a temperature of about 100° C. to about 600° C., and more preferably at a temperature of about 200° C. to about 400° C. Substrate 16 may be heated, for example, by an electrical resistance heater 18 on which substrate 16 is mounted. Other known methods of heating the substrate may also be utilized.

In this process, the precursor composition 40, which contains one or more pyrazolyl complexes (and/or other metal or metalloid complexes), is stored in liquid form (a neat liquid at room temperature or at an elevated temperature if solid at room temperature) in vessel 42. A source 44 of a suitable inert gas is pumped into vessel 42 and bubbled through the neat liquid (i.e., without solvent) picking up the precursor composition and carrying it into chamber 10 through line 45 and gas distributor 46. Additional inert carrier gas or reaction gas may be supplied from source 48 as needed to provide the desired concentration of precursor composition and regulate the uniformity of the deposition across the surface of substrate 16. As shown, a series of valves 50–55 are opened and closed as required.

Generally, the precursor composition is pumped into the CVD chamber 10 at a flow rate of about 1 sccm (standard cubic centimeters) to about 1000 sccm. The semiconductor substrate is exposed to the precursor composition at a pressure of about 0.001 torr to about 100 torr for a time of about 0.01 minute to about 100 minutes. In chamber 10, the precursor composition will form an adsorbed layer on the surface of the substrate 16. As the deposition rate is temperature dependent, increasing the temperature of the substrate will increase the rate of deposition. Typical deposition rates are about 10 Angstroms/minute to about 1000 Angstroms/minute. The carrier gas containing the precursor composition is terminated by closing valve 53.

Figure 3:
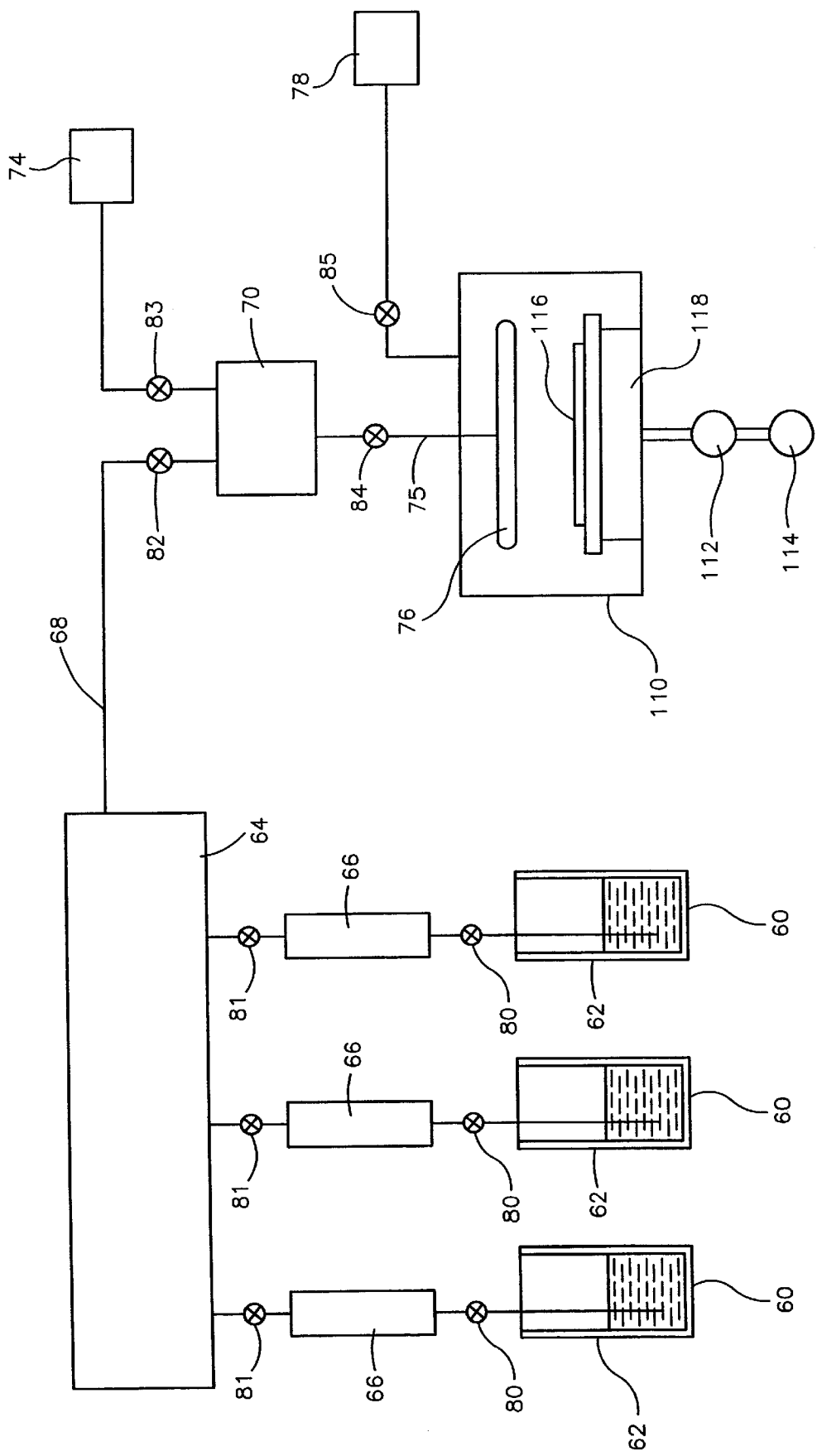
FIG. 3 is a perspective view of an alternative chemical vapor deposition coating system suitable for use in the method of the present invention.

An alternative CVD system that can be used to perform the process of the present invention is shown in FIG. 3. The system includes an enclosed chemical vapor deposition chamber 110, which may be a cold wall-type CVD reactor, in which a vacuum may be created using turbo pump 112 and backing pump 114. One or more substrates 116 (e.g., semiconductor substrates or substrate assemblies) are positioned in chamber 110. Substrate 116 may be heated as described with reference to FIG. 2 (for example, by an electrical resistance heater 118).

In this process, one or more solutions 60 of one or more pyrazolyl precursor complexes (and/or other metal or metalloid complexes), are stored in vessels 62. The solutions are transferred to a mixing manifold 64 using pumps 66. The resultant precursor composition containing one or more precursor complexes and one or more organic solvents is then transferred along line 68 to vaporizer 70, to volatilize the precursor composition. A source 74 of a suitable inert gas is pumped into vaporizer 70 for carrying volatilized precursor composition into chamber 110 through line 75 and gas distributor 76. Reaction gas may be supplied from source 78 as needed. As shown, a series of valves 80–85 are opened and closed as required. Similar pressures and temperatures to those described with reference to FIG. 2 can be used.

Alternatives to such methods include an approach wherein the precursor composition is heated and vapors are drawn off and controlled by a vapor mass flow controller, and a pulsed liquid injection method as described in "Metalorganic Chemical Vapor Deposition By Pulsed Liquid Injection Using An Ultrasonic Nozzle: Titanium Dioxide on Sapphire from Titanium (IV) Isopropoxide," by Versteeg, et al., *Journal of the American Ceramic Society*, 78, 2763–2768 (1995). The pyrazolyl complexes are also particularly well suited for use with vapor deposition systems, as described in copending application U.S. Ser. No. 08/720,710 entitled "Method and Apparatus for Vaporizing Liquid Precursor compositions and System for Using Same," filed on Oct. 2, 1996. Generally, one method described therein involves the vaporization of a precursor composition in liquid form (neat or solution). In a first stage, the precursor composition is atomized or nebulized generating high surface area microdroplets or mist. In a second stage, the constituents of the microdroplets or mist are vaporized by intimate mixture of the heated carrier gas. This two stage vaporization approach provides a reproducible delivery for precursor compositions (either in the form of a neat liquid or solid dissolved in a liquid medium) and provides reasonable growth rates, particularly in device applications with small dimensions.

Various combinations of carrier gases and/or reaction gases can be used in certain methods of the present invention. They can be introduced into the chemical vapor deposition chamber in a variety of manners, such as directly into the vaporization chamber or in combination with the precursor composition.

Although specific vapor deposition processes are described by reference to FIGS. 2–3, methods of the present invention are not limited to being used with the specific vapor deposition systems shown. Various CVD process chambers or reaction chambers can be used, including hot wall or cold wall reactors, atmospheric or reduced pressure reactors, as well as plasma enhanced reactors. Furthermore, methods of the present invention are not limited to any specific vapor deposition techniques.

The following examples are offered to further illustrate the various specific and preferred embodiments and techniques. It should be understood, however, that many variations and modifications may be made while remaining within the scope of the present invention.

EXAMPLES

All experiments are carried out using standard inert gas techniques.

Example 1

Preparation of Strontium bis(hydrotris(3,5-dimethyl-pyrazolyl)borate)

This compound is synthesized following the procedure in Belderrain et al., *Polyhedron* 15, 3453–3463 (1996).

Example 2

Preparation of Barium bis(hydrotris(3,5-dimethyl-pyrazolyl)borate)

This compound is synthesized following the procedure in Caulton et al., *J. Organomet. Chem.*, 46, C1–C2 (1993). This compound sublimes at about 210° C. and about 15 mTorr.

Example 3

Preparation of Titanium (hydrotris(3,5-dimethyl-pyrazolyl)borate) tris(isopropoxide)

Titanium chlorotris(isopropoxide) (2.61 g, 10 mmol) is reacted with potassium hydrotris(3,5-dimethylpyrazolyl)borate (3.36 g, 10 mmol) in 100 mL of THF. After 24 hours, the solvent is removed in vacuo and hexanes (50 mL) is added to extract the product. The solution is filtered in order to remove the precipitated potassium chloride. Removal of the solvent yields titanium (hydrotris(3,5-dimethyl-pyrazolyl)borate) tris(isopropoxide).

Example 4

Chemical Vapor Deposition of $(Ba, Sr)TiO_3$

Solutions of each of the precursors noted in Examples 1–3 are prepared by dissolving the solid compounds in THF to make 0.05M, 0.05M, and 0.1M solutions in the respective metal. The solutions are separately delivered to a vaporizer (COVA Technologies, Inc., Colorado Springs, Colo.) using syringe pumps. From here, the precursor vapor is carried into the chamber containing a substrate using He gas flow. Oxygen gas is delivered to the chamber by a separate tube using various flow rates, depending on the desired pressure in the chamber. Thickness of the deposited film is dependent upon deposition time and substrate temperature. The Ba:Sr:Ti ratio can be manipulated by the individual liquid delivery rates.

The foregoing detailed description and examples have been given for clarity of understanding only. No unnecessary limitations are to be understood therefrom. The invention is not limited to the exact details shown and described, for variations obvious to one skilled in the art will be included within the invention defined by the claims. The complete disclosures of all patents, patent documents, and publications listed herein are incorporated by reference, as if each were individually incorporated by reference.

What is claimed is:

1. A chemical vapor deposition precursor composition comprising two or more complexes comprising a Group IIA, IVB, VA, or VB metal and one or more anionic tris (pyrazolyl)borate ligands of the formula:

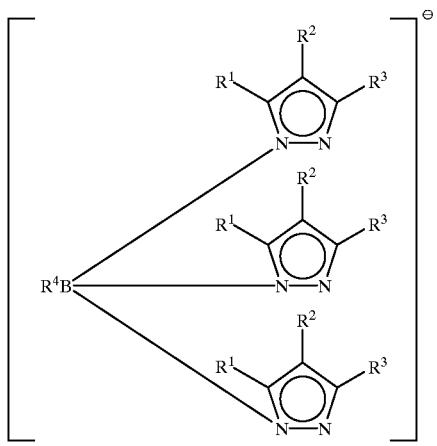

wherein each $R^1$, $R^2$, $R^3$, and $R^4$ group is independently H, an organic group, or a halide.

2. A chemical vapor deposition precursor composition comprising two or more complexes selected from the group consisting of $ML_2$, $M(O)L_2$, $M(OR^5)_xL_{4-x}$, and $M(OR^5)_yL_{5-y}$; wherein:

M is a Group IIA, IVB, VA, or VB metal;

each $R^5$ group is independently an organic group;

x=2 to 4;

y=2 to 5;

L is an anionic ligand of the following formula:

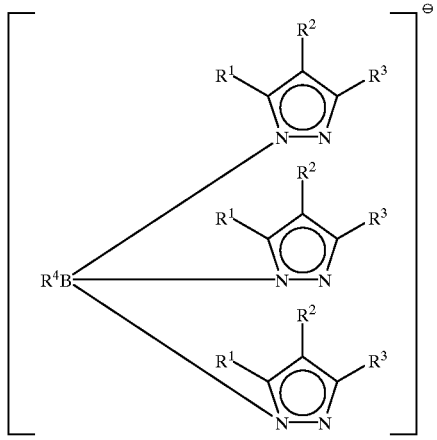

wherein each $R^1$, $R^2$, $R^3$, and $R^4$ group is independently H, an organic group, or a halide.

3. A chemical vapor deposition precursor composition comprising one or more complexes comprising a Group IIA, IVB, VA, or VB metal, with the proviso that at least one complex includes a metal selected from the group consisting of Zr, Hf, V, Nb, and Ta, and one or more anionic tris (pyrazolyl)borate ligands of the formula:

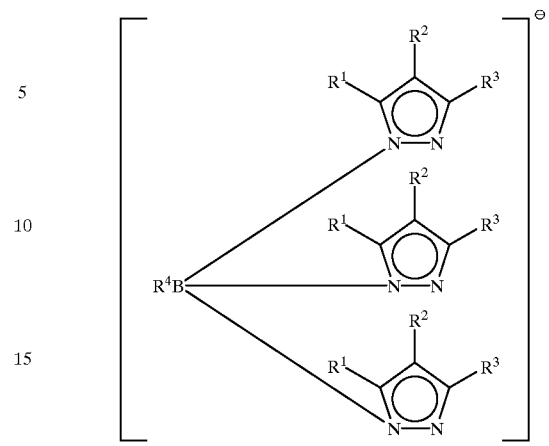

wherein each $R^1$, $R^2$, $R^3$, and $R^4$ group is independently H, an organic group, or a halide.

4. A metal complex of the formula $M(O)L_2$, $M(OR^5)_xL_{4-x}$, and $M(OR^5)_yL_{5-y}$; wherein:

M is a metal selected from the group consisting of Zr, Hf, V, Nb, and Ta;

each $R^5$ group is independently an organic group;

x=2 to 4;

y=2 to 5;

L is an an ionic ligand of the following formula:

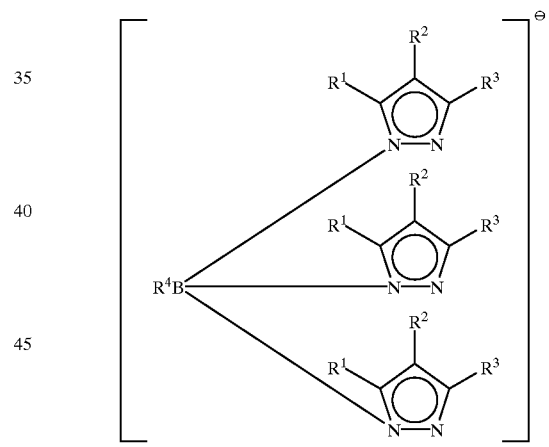

wherein each $R^1$, $R^2$, $R^3$, and $R^4$ group is independently H, an organic group, or a halide.

5. The precursor composition of claim 1 wherein the metal is selected from the group of Ba, Sr, Ti, and mixtures thereof.

6. The precursor composition of claim 2 wherein M is selected from the group of Ba, Sr, Ti, and mixtures thereof.

7. The precursor composition of claim 1 wherein the complexes are selected from the group of $ML_2$, $M(O)L_2$, $M(OR^5)_xL_{4-x}$, and $M(OR^5)_yL_{5-y}$, wherein L is the anionic tris(pyrazolyl)borate ligand, M is a Group IIA, IVB, VA, or VB metal, $R^5$ is an organic group, x=2 to 4, and y=2 to 5.

8. The precursor composition of claim 3 wherein the complexes are selected from the group of $ML_2$, $M(O)L_2$, $M(OR^5)_xL_{4-x}$, and $M(OR^5)_yL_{5-y}$, wherein L is the anionic tris(pyrazolyl)borate ligand, M is a Group IIA, IVB, VA, or VB metal, $R^5$ is an organic group, x=2 to 4, and y=2 to 5.

9. The precursor composition of claim 1 further comprising one or more metal complexes that do not contain the anionic tris(pyrazolyl)borate ligand.

10. The precursor composition of claim 2 further comprising one or more metal complexes that do not contain the anionic tris(pyrazolyl)borate ligand.

11. The precursor composition of claim 3 further comprising one or more metal complexes that do not contain the anionic tris(pyrazolyl)borate ligand.

12. The precursor composition of claim 1 wherein each $R^1$, $R^2$, $R^3$, and $R^4$ group is independently H or a $(C_1-C_{30})$ organic group.

13. The precursor composition of claim 2 wherein each $R^1$, $R^2$, $R^3$, and $R^4$ group is independently H or a $(C_1-C_{30})$ organic group.

14. The precursor composition of claim 3 wherein each $R^1$, $R^2$, $R^3$, and $R^4$ group is independently H or a $(C_1-C_{30})$ organic group.

15. The metal complex of claim 4 wherein each $R^1$, $R^2$, $R^3$, and $R^4$ group is independently H or a $(C_1-C_3)$ organic group.

16. The precursor composition of claim 1 wherein each $R^1$, $R^2$, $R^3$, and $R^4$ group is independently H or a $(C_1-C_8)$ organic group.

17. The precursor composition of claim 2 wherein each $R^1$, $R^2$, $R^3$, and $R^4$ group is independently H or a $(C_1-C_8)$ organic group.

18. The precursor composition of claim 3 wherein each $R^1$, $R^2$, $R^3$, and $R^4$ group is independently H or a $(C_1-C_8)$ organic group.

19. The metal complex of claim 4 wherein each $R^1$, $R^2$, $R^3$, and $R^4$ group is independently H or a $(C_1-C_8)$ organic group.

20. The precursor composition of claim 1 wherein $R^1$ and $R^3$ are methyl, and $R^2$ and $R^4$ are hydrogen.

21. The precursor composition of claim 2 wherein $R^1$ and $R^3$ are methyl, and $R^2$ and $R^4$ are hydrogen.

22. The precursor composition of claim 3 wherein $R^1$ and $R^3$ are methyl, and $R^2$ and $R^4$ are hydrogen.

23. The metal complex of claim 4 wherein $R^1$ and $R^3$ are methyl, and $R^2$ and $R^4$ are hydrogen.

24. The precursor composition of claim 1 wherein each of $R^1$ to $R^4$ is hydrogen.

25. The precursor composition of claim 2 wherein each of $R^1$ to $R^4$ is hydrogen.

26. The precursor composition of claim 3 wherein each of $R^1$ to $R^4$ is hydrogen.

27. The metal complex of claim 4 wherein each of $R^1$ to $R^4$ is hydrogen.

* * * * *

UNITED STATES PATENT AND TRADEMARK OFFICE
CERTIFICATE OF CORRECTION

PATENT NO. : 6,352,580 B1
DATED : March 5, 2002
INVENTOR(S) : Ulenbrock et al.

It is certified that error appears in the above-identified patent and that said Letters Patent is hereby corrected as shown below:

Title page,
Item [56], References Cited, OTHER PUBLICATIONS, in the "Dutremez et al.," reference, please delete "ligang for $Ba^{11}$" and insert -- ligand for $Ba^{II}$ --;

Column 3,
Line 58, please delete "trispyrazolyl)" and insert -- tris(pyrazolyl) --;

Column 4,
Line 11, please delete "$(C_5-C_2,$" and insert -- $(C_5-C_{20}$ --;

Column 5,
Line 36, please delete "(Formula II)" and insert -- (Formula III) --;

Column 7,
Line 56, please delete "material 1" and insert -- material 11 --

Column 10,
Line 19, please delete "46" and insert -- 462 --;

Column 13,
Line 20, please delete "$(C_1-C_{3,})$" and insert -- $(C_1-C_{30})$ --.

Signed and Sealed this

Fourteenth Day of January, 2003

JAMES E. ROGAN
*Director of the United States Patent and Trademark Office*